(12) United States Patent
Fricke et al.

(10) Patent No.: US 6,893,951 B2
(45) Date of Patent: May 17, 2005

(54) VERTICAL INTERCONNECTION STRUCTURE AND METHODS

(75) Inventors: Peter Fricke, Corvallis, OR (US); Andrew L. Van Brocklin, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/848,759

(22) Filed: May 18, 2004

(65) Prior Publication Data
US 2004/0214410 A1 Oct. 28, 2004

Related U.S. Application Data

(62) Division of application No. 10/202,105, filed on Jul. 23, 2002, now Pat. No. 6,774,458.

(51) Int. Cl.[7] ............... H01L 21/44; H01L 21/3205; H01L 21/8234

(52) U.S. Cl. ............... 438/600; 438/596; 438/608; 438/257; 438/268

(58) Field of Search ................ 438/596–608, 438/257–268

(56) References Cited

U.S. PATENT DOCUMENTS

| | | | |
|---|---|---|---|
| 3,271,591 A | | 9/1966 | Ovshinsky |
| 3,530,441 A | | 9/1970 | Ovshinsky |
| 3,641,516 A | | 2/1972 | Castrucci et al. |
| 4,499,557 A | | 2/1985 | Holmberg et al. |
| 4,599,705 A | | 7/1986 | Holmberg et al. |
| 4,666,252 A | * | 5/1987 | Yaniv et al. .......... 349/54 |
| 5,335,219 A | | 8/1994 | Ovshinsky et al. |
| 5,573,971 A | * | 11/1996 | Cleeves .......... 438/600 |
| 5,581,501 A | | 12/1996 | Sansbury et al. |
| 5,625,220 A | | 4/1997 | Liu et al. |
| 5,693,556 A | * | 12/1997 | Cleeves .......... 438/600 |
| 5,751,012 A | | 5/1998 | Wolstenholme et al. |
| 5,821,558 A | | 10/1998 | Han et al. |
| 5,847,441 A | | 12/1998 | Cutter et al. |
| 6,034,882 A | | 3/2000 | Johnson et al. |
| 6,051,851 A | * | 4/2000 | Ohmi et al. .......... 257/185 |

(Continued)

OTHER PUBLICATIONS

Chan et al, "Multiple Layers of CMOS Integrated Circuits Using Recrystallized Silicon Film", IEEE Electron Device Letters, V.22 (2), Feb. 2001, pp 77–79.

Thomas H Lee, "A Vertical Leap for Microchips", Scientific American, Jan. 2002, pp 53–59.

Hamdy et al, "Dielectric based antifuses for logic and memory ICs", IEEE Int'l Electron Devices Meeting, IEDM 88, Aug. 1988, pp 786–789.

Chenming Hu, "Interconnect devices for field programmable gate array", IEEE Int'l Electron Devices Meeting, IEDM 92, Apr. 1992, pp 591–594.

Jonathan Green et al, "Antifuse Field Programmable Gate Arrays", Proc. IEEE, vol. 81(7), Jul. 1993, pp 1042–1056.

Kulkarni et al, "Patterning of Submicron Metal Features and Pillars in Multilevel Metallization", J. Electrochem Soc., V. 135 (12), Dec. 1988, pp 3094–3098.

Primary Examiner—Michael Lebentritt

(57) ABSTRACT

Interconnection structures for integrated circuits have first cells disposed in a first plane, at least second cells disposed in at least a second plane parallel to the first plane, and vertical interconnections disposed for connecting conductors in the first plane with conductors in the second plane, at least some of the vertical interconnections initially incorporating antifuses. The antifuses may be disposed over conductors that are disposed on a base substrate. The antifuses are selectively fused to prepare the integrated circuit for normal operation. Methods for fabricating and using such vertical interconnection structures are disclosed.

28 Claims, 6 Drawing Sheets

U.S. PATENT DOCUMENTS

| | | |
|---|---|---|
| 6,111,302 A | 8/2000 | Zhang et al. |
| 6,118,138 A | 9/2000 | Farnworth et al. |
| 6,153,468 A | 11/2000 | Forbes et al. |
| 6,185,122 B1 | 2/2001 | Johnson et al. |
| 6,251,710 B1 | 6/2001 | Radens et al. |
| 6,288,437 B1 | 9/2001 | Forbes et al. |
| 6,297,989 B1 | 10/2001 | Cloud et al. |
| 6,351,406 B1 | 2/2002 | Johnson et al. |
| 6,372,633 B1 | 4/2002 | Maydan et al. |
| 6,380,003 B1 | 4/2002 | Jahnes et al. |
| 6,483,736 B2 | 11/2002 | Johnson et al. |
| 6,521,958 B1 | 2/2003 | Forbes et al. |
| 6,661,691 B2 | 12/2003 | Fricke et al. |
| 6,781,858 B2 * | 8/2004 | Fricke et al. .............. 365/51 |
| 2001/0011776 A1 | 8/2001 | Igarashi et al. |
| 2001/0036750 A1 | 11/2001 | Radens et al. |
| 2001/0055838 A1 | 12/2001 | Walker et al. |
| 2002/0058408 A1 | 5/2002 | Maydan et al. |
| 2002/0075719 A1 | 6/2002 | Johnson et al. |
| 2002/0083390 A1 | 6/2002 | Lee et al. |

* cited by examiner

US 6,893,951 B2

VERTICAL INTERCONNECTION STRUCTURE AND METHODS

RELATED APPLICATIONS

This application is a divisional of application Ser. No. 10/202,105, filed Jul. 23, 2000 now U.S. Pat. No. 6,774,458 which is incorporated by reference herein.

This application is related to copending and commonly-owned U.S. patent application Ser. No. 10/001,740 filed Oct. 31, 2001 and Ser. No. 10/051,677 filed Jan. 16, 2002, and to copending and commonly-owned U.S. patent application Ser. Nos. 10/115,744, 10/115,750, 10/115,763, 10/116,213, and 10/116,497, each filed Apr. 2, 2002.

FIELD OF THE INVENTION

This application relates to interconnection structures especially useful in semiconductor devices, such as integrated circuits and memory devices, and relates to methods for fabricating and using such structures.

BACKGROUND ART

Integrated circuits including arrays of memory nodes or logic gates have increased steadily in density. Such integrated circuits have included dynamic random access memory (DRAM) devices, static random access memory (SRAM) devices, programmable read-only memory (PROM) integrated circuits, electrically erasable programmable read-only memory (EEPROM) integrated circuits, write-once read-many (WORM) memory devices, and logic devices such as programmable logic array (PLA) integrated circuits, among others. Integrated circuits having arrays of devices, gates, or memory nodes disposed on multiple levels require "vertical" interconnections or "pillars" to interconnect devices, gates, or memory nodes on one level with other devices, gates, or nodes on other levels. In this context, the term "vertical" differs from its everyday connotation in that it does not refer to the direction of gravity. Throughout this specification, the drawings, and the appended claims, the term "vertical" refers to a direction generally perpendicular to a substrate or base plane of an integrated circuit. Also, the term "pillar" referring to an interconnection and the term "vertical interconnection" are used interchangeably to mean an interconnection communicating between different layers of an integrated circuit, regardless of the spatial orientation of those different layers. Integrated circuits herein include not only monolithic integrated circuits, but also hybrid integrated circuits and multi-layer or "stacked" modules. The term "cell" herein refers to a functional element of an array, such as a memory node, a logic gate, a switching device, a field-effect device, or a semiconductor device. The term "redundant" as used herein describes an element not needed for normal operation of an integrated circuit after its fabrication is complete. Of course, such "redundant" elements, when used temporarily to perform a function during fabrication of the integrated circuit, are not redundant during the fabrication process.

There is a continuing need for increased device density in integrated circuits, including multi-layer integrated circuits and for efficient vertical interconnection structures within such multi-layer integrated circuits.

BRIEF DESCRIPTION OF DRAWINGS

To clarify features and advantages of the invention, a detailed description of the invention will be rendered by reference to specific embodiments thereof, which are illustrated in the appended drawings. The same numbers are used throughout the drawings to refer to like features and components. It will be appreciated that these drawings depict only typical embodiments of the invention and are therefore not to be considered limiting of its scope. The invention will be described and explained with additional specificity and detail through the use of the accompanying drawings in which.

DETAILED DESCRIPTION OF EMBODIMENTS

Figure 1:
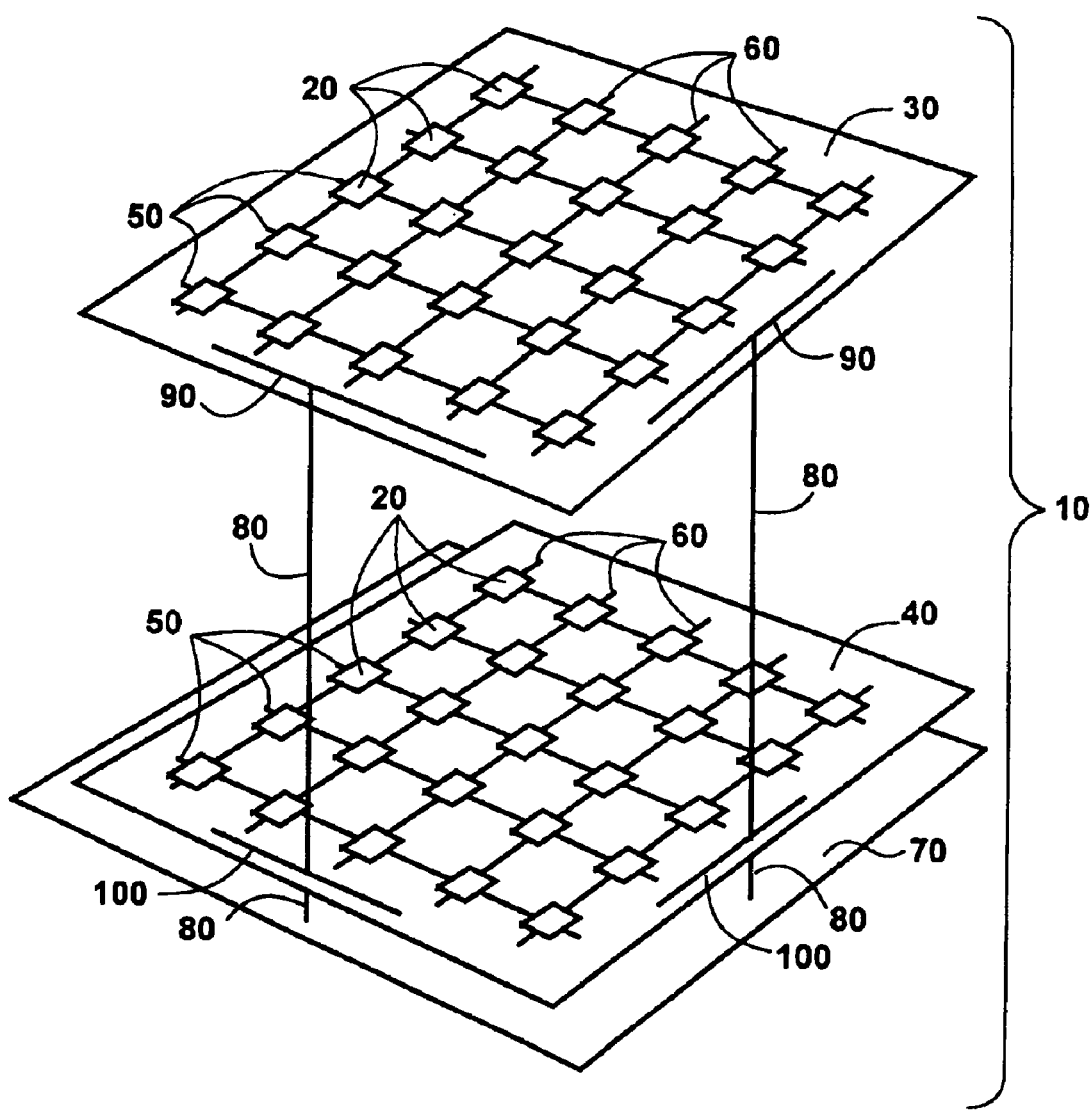
FIG. 1 shows a schematic diagram illustrating elements of a multi-level integrated circuit to which interconnection embodiments made in accordance with the invention may be applied.

For clarity of exposition, the drawings are not drawn to any uniform scale. In particular, vertical and horizontal scales may be different, and thus angles in the drawings may be smaller or larger than those in devices as actually fabricated.

FIG. 1 shows a schematic diagram illustrating elements of a multi-level integrated circuit 10 to which interconnection embodiments made in accordance with the invention may be applied. Integrated circuit 10 has arrays of cells 20 arranged on planes 30 and 40. Individual cells are addressed by row lines 50 and column lines 60. While FIG. 1 shows two planes 30 and 40, it will be recognized that a multi-level integrated circuit 10 may consist of more than two planes and may have many such planes. In practice, typically, the maximum number of planes is limited by practical considerations, such as the overhead circuitry associated with each additional plane, the number of different mask levels required, and the number of process steps required (for example, to planarize each level).

Within each plane are in-plane conductors such as conductor 90 in plane 30 and conductor 100 in plane 40. Electrical connections made by conductors 90 and 100 are not shown in FIG. 1. Vertical interconnections 80 connect conductors 90 on one plane (e.g., plane 30) to conductors 100 on a different plane (e.g., plane 40), extending in this example at least from plane 30 to plane 40. Planes 30 and 40 are normally formed substantially parallel to a base plane or substrate 70, such as a silicon wafer or glass or ceramic substrate, which may have an insulating layer on its surface, if required. As shown in FIG. 1, vertical interconnections 80 may extend to substrate 70 and may be electrically coupled to devices (not shown in FIG. 1) located on substrate 70.

Vertical interconnections, or "pillars," are known in the art, not only in monolithic integrated circuits, but also in hybrid integrated circuits and multi-layer or "stacked" modules. Typically, such vertical interconnections are made by forming separate vias through the insulating layers between planes, filling such vias with conductive materials, and stacking the vias to extend the vertical interconnection to the required plane. When a layer of insulating material, such as an oxide, is used in fabrication of devices in a plane, typically that insulating material must be removed from the location of the vias in order to provide continuity of the electrical connection through the stack of vias. Otherwise, the insulating layer would interrupt the DC electrical continuity. This localized selective removal of an oxide or other insulating layer normally requires an etch process performed through a patterned mask layer so that the insulating material is removed only over the vias and any other selected locations. One advantage of the present invention over the prior art is that such masking and etch processes to remove an oxide layer are not needed.

In multi-level integrated circuit 10, row conductors and column conductors form an orthogonal set of wiring channels. If integrated circuit 10 is a memory, individual memory cells are addressed by a combination of a row conductor, e.g., a word line, and a column conductor, e.g., a bit line. It will be recognized that other types of integrated circuits, such as field-programmable gate arrays (FPGA's) also require wiring channels to address their cells, such as the individual gates of the gate array.

One aspect of the present invention is a vertical interconnection structure interconnecting first cells and a first conductor disposed in a first plane with at least second cells and a second conductor disposed in at least a second plane substantially parallel to the first plane, and including a vertical interconnection disposed for connecting the first conductor with the second conductor, the vertical interconnection extending at least between the first and second planes and initially including an antifuse. This aspect is exemplified by various particular embodiments described next below.

Figure 2A:
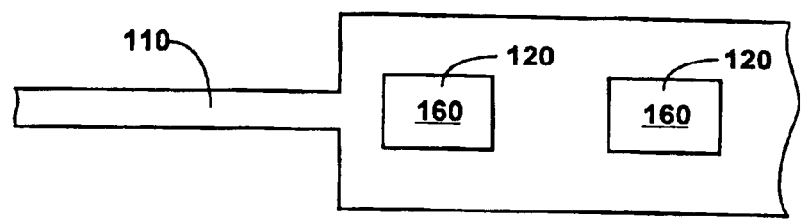
FIG. 2A shows a top plan view illustrating vertical interconnection embodiments made in accordance with the invention.
Figure 2B:
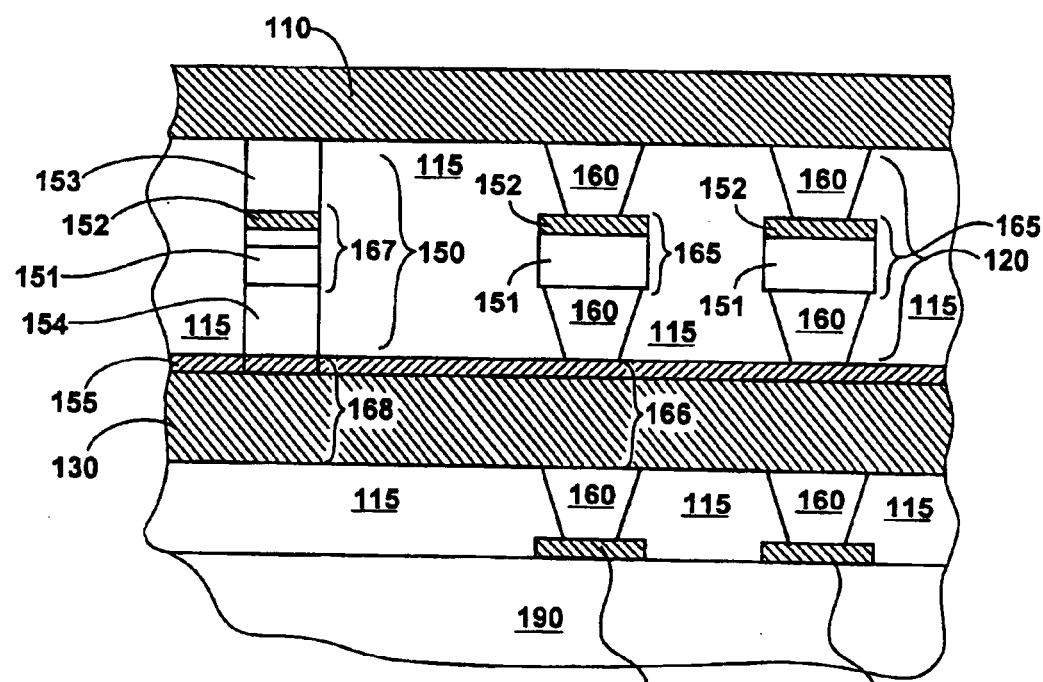
FIG. 2B shows a side elevation cross-sectional view illustrating vertical interconnection embodiments made in accordance with the invention, corresponding to FIG. 2A.

FIGS. 2A and 2B respectively show a top plan view and a corresponding side-elevation cross-sectional view illustrating vertical interconnection embodiments made in accordance with the invention. A patterned conductor 110, connected to the tops of two via stacks 120, is shown in FIG. 2A. As shown in FIG. 2B, there are two stacks, each having two individual conductive vias 160 vertically aligned and electrically coupled with each other. The individual vias 160 are filled with a first conductive material, which may be tungsten, for example. The two stacks extend downward from top conductor 110 on a first plane, at least to a lower conductor 130 on a second plane below. Between the two individual vias 160 of each stack are two other layers, a conductor 151 covered with a thin insulating layer 152, which together form an antifuse 165 as described in more detail below. Below the lower via 160 of each stack is another thin insulating layer 155, which covers lower conductor 130, forming another antifuse 166. As shown in FIG. 2B, the via stacks may be extended below conductor 130 toward the top surface of a substrate 190. Optionally, separate bonding pads 170 and 180 may be provided at or near substrate 190, allowing electrical contacts with higher voltage and current capabilities, for faster fusing of antifuses 165 and 166.

An antifuse is an element whose resistance is normally high and whose resistance switches to a low value when a suitable signal is applied. Various antifuses are known in the art, being disclosed, for example, in U.S. Pat. Nos. 5,821,558 and 6,111,302.

Shown in cross-section at the left side of FIG. 2B is an embodiment of a structure 150, which is a stack of two tunnel-junction memory cells. A tunnel-junction device has electrical characteristics such that, for linear increases in voltage, the tunnel junction exhibits an exponential increase in current. A memory cell utilizing a tunnel junction has an advantage in access speed over many other types of cells, since it is capable of being accessed in a time of the order of a few nanoseconds or less.

Starting at the top of structure 150, there is a tunnel-junction diode 153, an antifuse 167 consisting of conductor 151 and thin insulating layer 152, another tunnel-junction diode 154, and another antifuse 168 consisting of conductor 130 and thin insulating layer 155. When a structure 150 is used, conductors 110 and 130 may be row conductors, for example, and conductor 151 may be a column conductor, for example, for addressing the memory cells. (Although not shown as such in the drawing, conductor 151 can extend in a direction in or out of the figure, orthogonally to conductors 110 and 130, for convenient use as a column conductor.) As will become clear from the drawings and the process descriptions below, memory-cell stack structure 150 is specially adaptable for use with vertical interconnection structures 120 embodying the present invention (and vice versa).

Thus, the vertical interconnection structure uses a tunnel-junction antifuse oxide that can also be used as a portion of each functional cell in the integrated circuit. Conversely, when an integrated circuit uses a cell, such as a memory cell, employing a tunnel-junction antifuse oxide, that antifuse oxide can be further utilized in vertical interconnection structures, while avoiding mask patterning, etching, and cleaning process steps that would otherwise be necessary.

Embodiments such as that shown in FIGS. 2A and 2B may be made using materials and processes of conventional semiconductor integrated circuit fabrication, including patterning (by photolithography, for example), and deposition of known substances.

Conductive elements such as row conductors 110 and 130 and column conductor 151 may be formed by depositing and patterning a conductive material: aluminum, copper, copper-aluminum alloy, silicide, amorphous silicon, microcrystalline silicon, or a refractory metal such as tungsten or an alloy thereof. Such row and column conductors may have a thickness in a typical range from about 20 nanometers (200 Angstroms) to about 500 nanometers (5000 Angstroms), typically about 180 nanometers (1800 Angstroms).

Electrically insulating layers 115 may be composed, for example, of a material such as wet or dry silicon dioxide ($SiO_2$), a nitride material such as silicon nitride, tetraethylorthosilicate (TEOS) based oxides, borophosphosilicate glass (BPSG), phosphosilicate glass (PSG), borosilicate glass (BSG), polyimide film, polyamide film, oxynitride, spun-on glass (SOG), a chemical vapor deposited (CVD) dielectric including a deposited oxide, a grown oxide, or similar dielectric materials. When composed of TEOS based oxides, insulating layer 115 can be formed by a deposition resulting from the decomposition of a TEOS gas in a reactor.

Vias 160 may be filled with a refractory metal such as tungsten, for example, or an alloy thereof, e.g., with molybdenum.

The thin-insulator voltage-breakdown layer 152 or 155 may be composed of an electrically insulating material such as oxide-nitride-oxide (ONO), tantalum pentoxide ($Ta_2O_5$), plasma-enhanced silicon nitride, titanium oxide, germanium oxide, or a chemical-vapor-deposited (CVD) dielectric including a deposited oxide, a grown oxide, or similar dielectric materials.

Embodiments of the integrated circuits using the vertical interconnection structure of the invention are fabricated upon a conventional supporting structure 190 such as a flat silicon semiconductor wafer substrate, which may have an insulating layer on its surface if necessary. Alternatively, the substrate 190 may be made of glass, gallium arsenide, silicon on sapphire (SOS), epitaxial formations, germanium, germanium silicon, diamond, silicon-on-insulator (SOI) material, selective implantation of oxygen (SIMOX) substrates, and/or like substrate materials.

Figure 3:
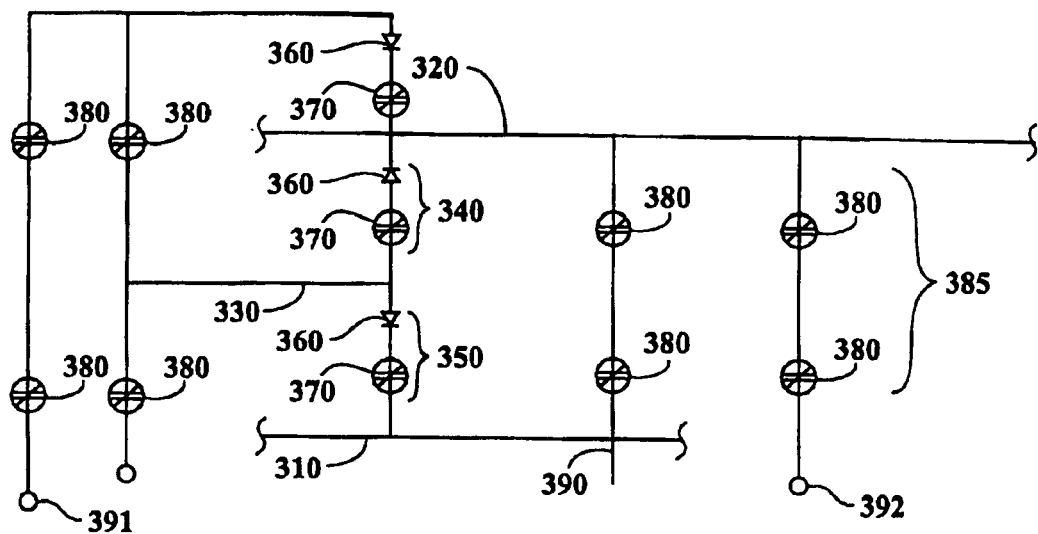
FIG. 3 shows an electrical schematic diagram illustrating vertical interconnection embodiments made in accordance with the invention.

FIG. 3 shows an electrical schematic illustrating vertical interconnection embodiments made in accordance with the invention. Row lines such as ROW 0 line 310 and ROW 1 line 320 and column lines such as COL 1 line 330 perform their normal addressing functions in the arrays. Each pair comprised of a diode 360 and an antifuse 370 connected together forms a cell such as cell 340 or 350. Antifuses 380 in the vertical interconnections complete the connection through vertical interconnection stack 385 when and if each antifuse 380 is fused. Optionally, some or all vertical interconnections thus completed may extend (390) to devices (not shown) at the base-level substrate 190.

As described hereinbelow, in the section titled "Fabrication Methods," some methods used in accordance with the invention employ redundant column (or bit-line) vertical interconnects 391 and/or redundant row (or word-line) vertical interconnects 392, both shown in FIG. 3.

In use of the present invention, antifuses 165 and 166 (or 380) are formed initially in the vertical interconnection structures within the integrated circuit, and subsequently, selected antifuses among them are fused to prepare the integrated circuit for normal operation. Those antifuses which are not selected for fusing remain in place and do not contribute to normal functioning of the integrated circuit unless they are fused at some later time to provide additional vertical interconnections.

Thus, an integrated circuit structure may be made having at least two arrays of cells, with the arrays on parallel planes, and conductors on different planes being selectively interconnected by a vertical interconnection structure as described hereinabove. For some applications, the integrated circuit structure may have two to eight layers, for example. Other embodiments of the structure may have from eight to twelve layers. Unlike many other structures known in the art, which have an overhead cost associated with each layer and thus a practical economic limit to the number of layers, there is no known limit to the number of layers that can be accommodated in a structure made in accordance with the present invention. Thus, there may be even more than twelve layers, the number of layers being essentially unlimited.

Specifically, a memory may be made with the memory cells or nodes addressed by row and column lines selectively interconnected by such a vertical interconnection structure, and a mass storage device may be made from such memories. A description of fabrication methods follows, including embodiments of methods specially adapted for fabricating vertical interconnection structures in accordance with the present invention.

Fabrication Methods

Figure 4:
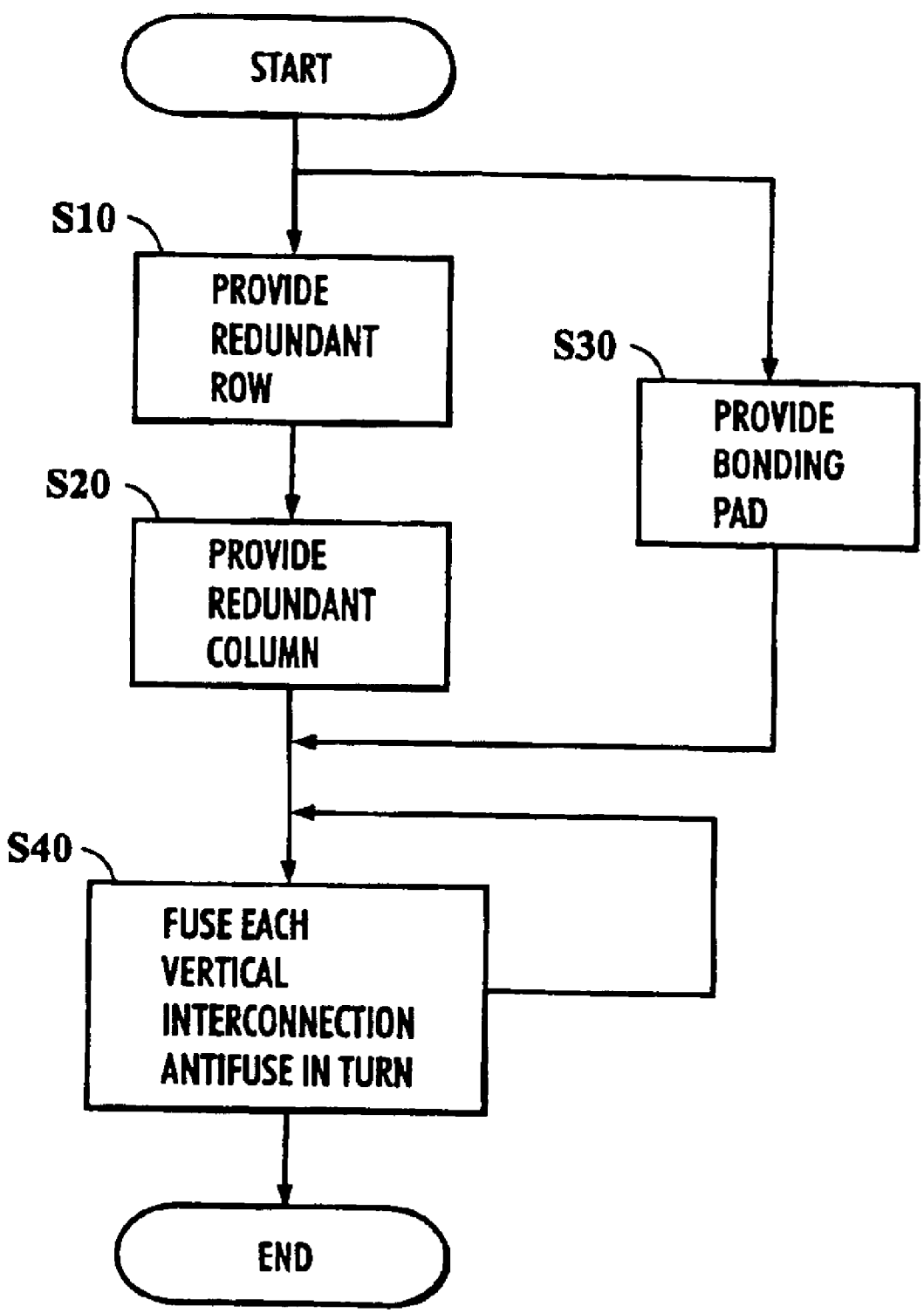
FIG. 4 shows a flowchart illustrating a first method embodiment for fabricating vertical interconnection structures in accordance with the invention.
Figure 6:
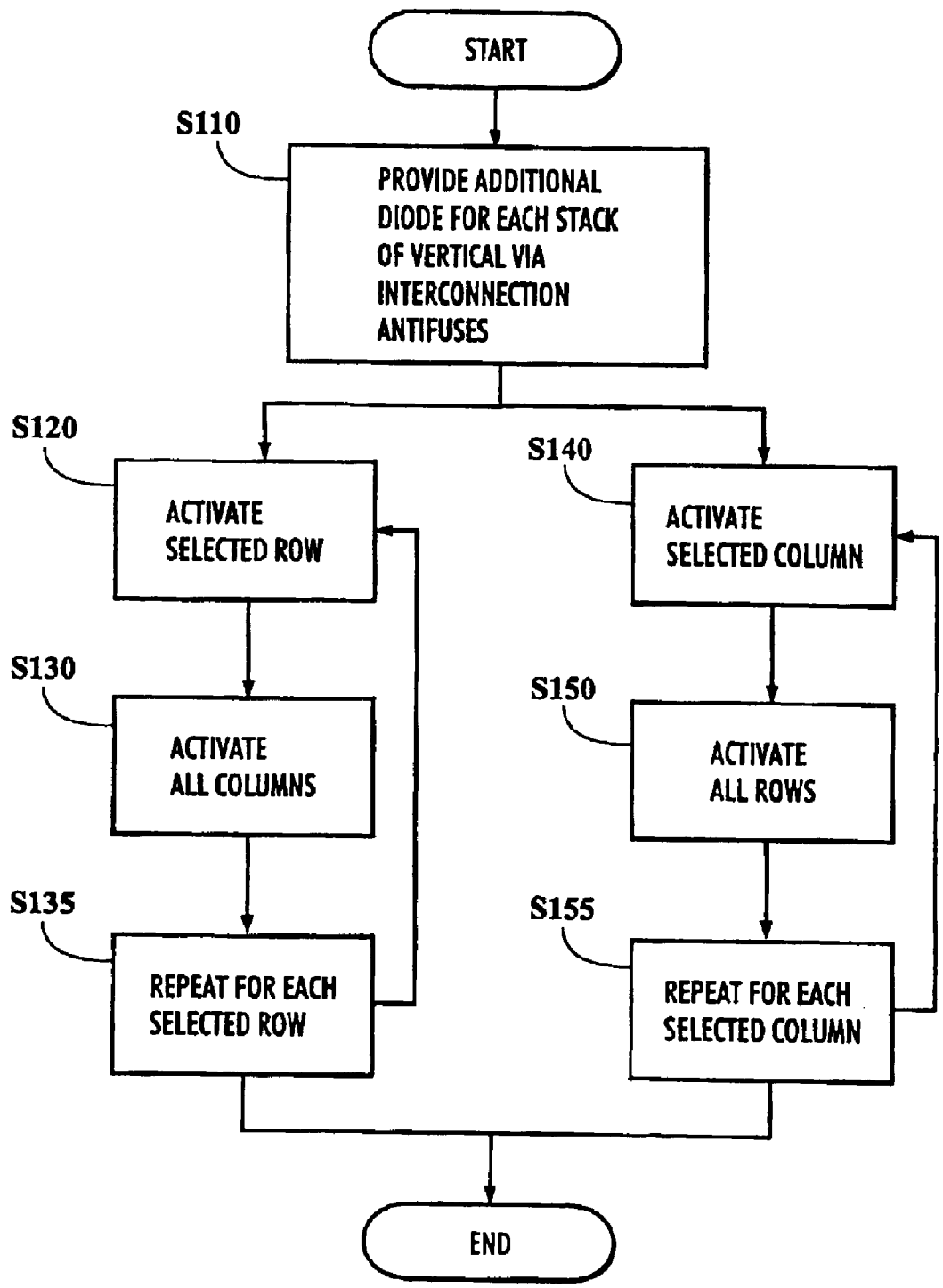
FIG. 6 shows a flowchart illustrating a second method embodiment for fabricating vertical interconnection structures in accordance with the invention.

Overall fabrication methods suitable for making the present invention are described in commonly-owned U.S. patent application Ser. No. 10/001,740 filed Oct. 31, 2001 and Ser. No. 10/116,213 filed Apr. 2, 2002, the entire disclosure of each of which is incorporated herein by reference. FIGS. 4 and 6 show flowcharts illustrating alternative method embodiments for fabricating particular vertical interconnection structures in accordance with the invention. Steps of the methods are denoted by reference numerals S10, S20, . . . , and S150.

The flow chart of FIG. 4 illustrates a first method, utilizing redundant row and column conductors to fuse the vertical interconnection antifuses. A redundant row conductor is provided (step S10) and a redundant column conductor is provided (step S20).

Figure 5:
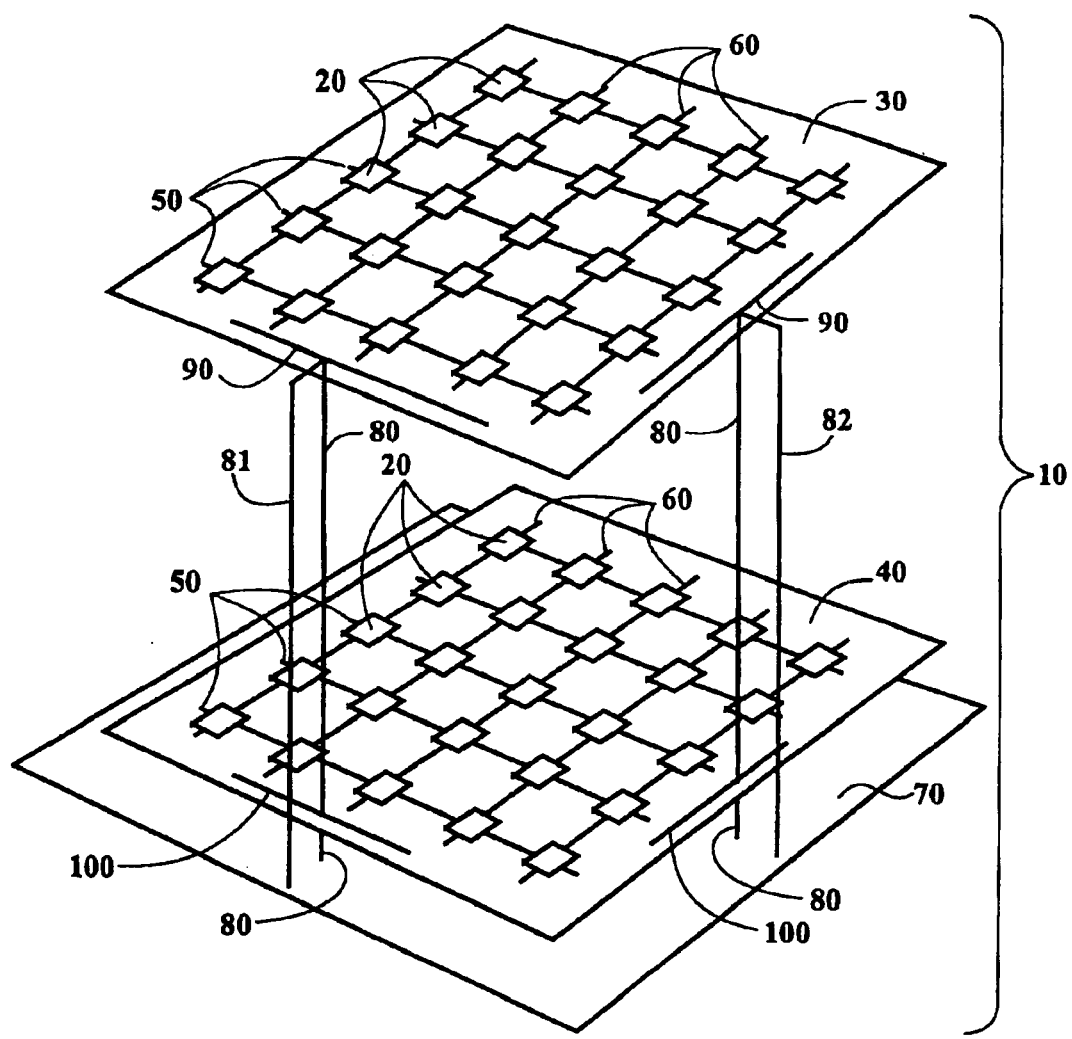
FIG. 5 shows a schematic diagram of a multi-level integrated circuit embodiment made in accordance with the invention.

FIG. 5 shows a schematic diagram of a multi-level integrated circuit embodiment made in accordance with the invention. The redundant row conductor 81 provided in step S10 and the redundant column conductor 82 provided in step S20 are both shown in FIG. 5. The redundant conductors 81 and 82 are made with sizes sufficient to carry the fusing current needed to fuse the vertical interconnection junctions. While the locations of the redundant row and column conductors are not critical to operation of the invention, it is desirable to position the redundant conductors adjacent to the edges of the array near the row and column drive circuitry (and in a memory integrated circuit near the read logic), rather than inside the array, where they could otherwise reduce array density. Optionally, a bonding pad (not shown in FIG. 5) is provided (step S30) for each redundant row and column conductor, to allow higher fusing current for faster fusing. Then each vertical interconnection antifuse is fused in turn (step S40) using the redundant row and column conductors, repeating this process for each selected vertical interconnection to be completed.

Figure 7:
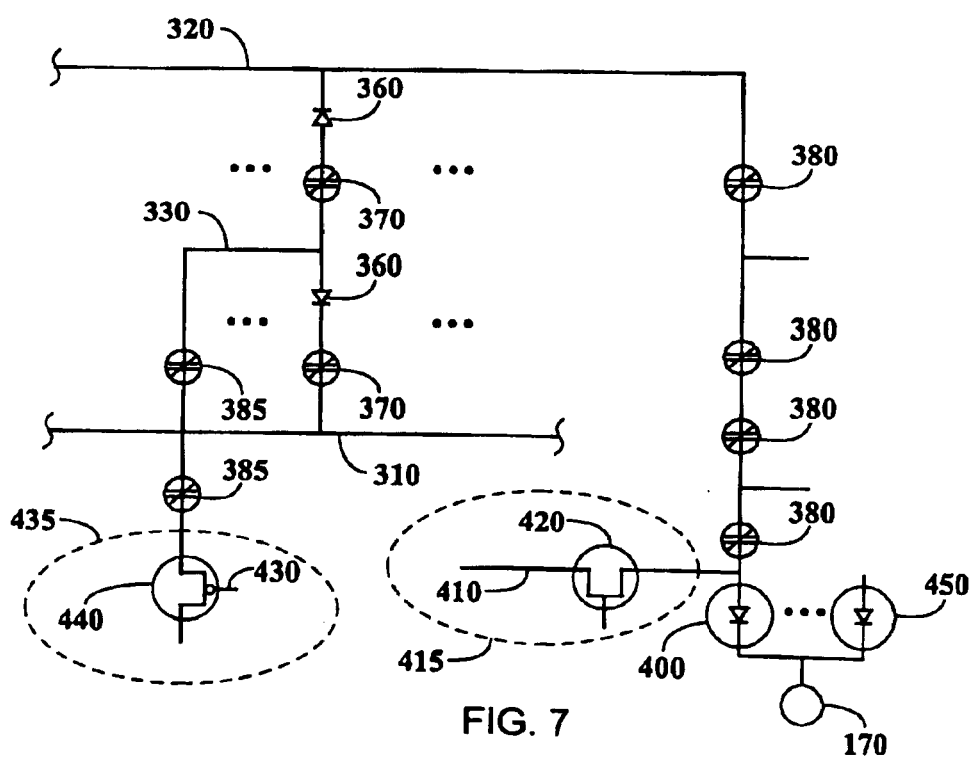
FIG. 7 shows a schematic diagram illustrating elements of a memory integrated circuit made in accordance with the invention.

FIG. 6 shows a flow chart illustrating a second method for fabricating a vertical interconnection structure in accordance with the invention. The embodiment illustrated in FIG. 6 may be applied to arrays having, for example, n rows by m columns, i.e., an "n×m" array. The method illustrated in FIG. 6 utilizes the n by m array elements themselves to provide fusing current for fusing the vertical interconnection antifuses. FIG. 7 shows a schematic diagram illustrating elements of a memory integrated circuit made in accordance with the invention and using this method. In FIG. 7, diodes 360 and antifuses 370 are normally connected between column line 330 and row lines 310 and 320. The ellipses (rows of dots) in FIG. 7 denote the normal repetition of that structure multiple times in a parallel fashion throughout the integrated circuit arrays. In this embodiment, a stack of antifuses 380 (shown at the right side of FIG. 7) is to be fused to connect row line 320 to devices located at base substrate wafer 390, i.e., to devices 400 and 420. A different stack of antifuses 385 is to be separately fused to connect column line 330 to device 440 located at base substrate wafer 390.

In the method illustrated in FIG. 6, an additional diode 450 is provided (step S10) for each stack of vertical interconnection antifuses. To fuse a row interconnect via stack, such as the stack of antifuses 380 in FIG. 7, the selected row is activated (step S120) while all columns are activated (step S130). This process is repeated for each selected row interconnect via stack. To fuse a column interconnect via stack, such as the stack of antifuses 385 in FIG. 7, the selected column is activated (step S140) while all rows are activated (step S150). This process is repeated for each selected column interconnect via stack. In this method, the fusing current is distributed through each of the parallel memory elements in a row or column.

Industrial Applicability

The vertical interconnection structures of the invention and the inventive methods specially adapted for making and using them are especially useful in semiconductor devices such as memory integrated circuits. Integrated circuits of many types, including such integrated circuit types as the memory embodiment example described above, may be made with interconnection structures fabricated in accordance with the invention. Such structures and integrated circuits employing them are useful in apparatus such as mobile or stationary telephones, digital cameras and camcorders, computing devices (such as desktop and portable computers, calculators, and personal digital assistants (PDA's) and their peripheral devices), media players such as players for CD's, DVD's, music, and video, and apparatus for printing, scanning, storing, copying, facsimile reproduction, and transmitting of documents. The latter apparatus may include multifunction devices.

Other embodiments of the invention will be apparent to those skilled in the art from a consideration of this specification or from practice of the invention disclosed herein. For example, antifuses used in the present invention may be fused by methods other than the methods described explicitly herein, such as by providing external probes temporarily for supplying fusing current to selected antifuses during preparation of the integrated circuits for normal use.

It is intended that the specification and examples disclosed herein be considered as exemplary only, with the true scope and spirit of the invention being defined by the following claims. Accordingly, the scope of the invention should be determined not by the embodiments illustrated, but by the appended claims and their legal equivalents.

What is claimed is:

1. A method for fabricating integrated circuits of the type having first cells and a first conductor disposed in a first plane, and at least second cells and a second conductor disposed in at least a second plane substantially parallel to the first plane, said method comprising the steps of:
    a) forming a vertical interconnection disposed for connecting said first conductor with said second conductor, said vertical interconnection extending at least between said first and second planes and initially including an antifuse, and
    b) subsequently fusing said antifuse to form a continuous electrical connection for electrically coupling said first conductor with at least said second conductor.

2. An integrated circuit fabricated by the method of claim 1.

3. A method for fabricating integrated circuits, comprising the steps of:
    a) disposing first cells and a first conductor in a first plane,
    b) disposing at least second cells and a second conductor in at least a second plane substantially parallel to the first plane,
    c) forming a vertical interconnection disposed for connecting said first conductor with said second conductor, said vertical interconnection extending at least between said first and second planes and initially including an antifuse, and
    d) subsequently fusing said antifuse to form a continuous electrical connection for electrically coupling said first conductor with at least said second conductor.

4. An integrated circuit fabricated by the method of claim 3.

5. The method of claim 3, wherein said vertical-interconnection forming step (c) is performed by a sub-method comprising the steps of:
    i) disposing a suitable thin oxide upon said first conductor, and
    ii) disposing a conductive via material upon said suitable thin oxide whereby a tunnel-junction antifuse is formed.

6. The method of claim 3, wherein said antifuse-fusing step (d) is performed by applying a voltage and current sufficient to form a continuous electrical connection.

7. The method of claim 3, wherein said antifuse-fusing step (d) is performed by applying a current through a conductor redundant to normal operation of said integrated circuits.

8. The method of claim 3, wherein said antifuse-fusing step (d) is performed by applying a current through a diode.

9. A method for fabricating integrated circuits, comprising the steps of:
    a) forming and disposing first cells and a first conductor in a first plane,
    b) forming and disposing at least second cells and a second conductor in at least a second plane substantially parallel to the first plane,
    c) forming a vertical interconnection disposed for connecting said first conductor with said second conductor, said vertical interconnection extending at least between said first and second planes and initially including an antifuse, said antifuse being formed by substeps comprising:
        i) disposing a suitable thin oxide upon said first conductor, and
        ii) disposing a conductive via material upon said suitable thin oxide whereby a tunnel-junction antifuse is formed, and
    d) subsequently fusing said antifuse by applying a voltage and current sufficient to form a continuous electrical connection for electrically coupling said first conductor with at least said second conductor.

10. An integrated circuit fabricated by the method of claim 9.

11. The method of claim 9, wherein said antifuse-fusing step (d) is performed by applying a current through a conductor redundant to normal operation of said integrated circuits.

12. An integrated circuit fabricated by the method of claim 11.

13. The method of claim 9, wherein said antifuse-fusing step (d) is performed by applying a current through a diode.

14. An integrated circuit fabricated by the method of claim 13.

15. A method for fabricating integrated circuits, said method comprising the steps of:
    a) disposing first cells and a first conductor in a first plane,
    b) providing a multiplicity of row conductors and a multiplicity of column conductors,
    c) disposing at least second cells and a second conductor in at least a second plane substantially parallel to the first plane, at least one of said first and second conductors being coupled to one of said multiplicity of row conductors,
    d) forming a vertical interconnection disposed for connecting said first conductor with said second conductor, said vertical interconnection extending at least between said first and second planes and initially including an antifuse, and
    e) subsequently fusing said antifuse to form a continuous electrical connection for electrically coupling said first conductor with at least said second conductor by activating said one of said multiplicity of row conductors and all of said multiplicity of column conductors.

16. An integrated circuit fabricated by the method of claim 15.

17. The method of claim 15, further comprising selectively repeating said fusing step (e) for each selected row conductor of said multiplicity of row conductors.

18. An integrated circuit fabricated by the method of claim 17.

19. A method for fabricating integrated circuits, said method comprising the steps of:

a) disposing first cells and a first conductor in a first plane, b) providing a multiplicity of row conductors and a multiplicity of column conductors, c) disposing at least second cells and a second conductor in at least a second plane substantially parallel to the first plane, at least one of said first and second conductors being coupled to one of said multiplicity of column conductors, d) forming a vertical interconnection disposed for connecting said first conductor with said second conductor, said vertical interconnection extending at least between said first and second planes and initially including an antifuse, and e) subsequently fusing said antifuse to form a continuous electrical connection for electrically coupling said first conductor with at least said second conductor by activating said one of said multiplicity of column conductors and all of said multiplicity of row conductors.

20. An integrated circuit fabricated by the method of claim 19.

21. The method of claim 19, further comprising selectively repeating said fusing step (e) for each selected column conductor of said multiplicity of column conductors.

22. An integrated circuit fabricated by the method of claim 21.

23. A method for fabricating integrated circuits, comprising the steps of:

a) disposing first cells and a first conductor in a first plane, b) providing at least one redundant row conductor and at least one redundant column conductor, c) disposing at least second cells and a second conductor in at least a second plane substantially parallel to the first plane, d) forming a vertical interconnection disposed for connecting said first conductor with said second conductor, said vertical interconnection extending at least between said first and second planes and initially including an antifuse, and e) subsequently fusing said antifuse by supplying to at least one of said at least one redundant row conductor and said at least one redundant column conductor sufficient voltage and current to form a continuous electrical connection for electrically coupling said first conductor with at least said second conductor.

24. An integrated circuit fabricated by the method of claim 23.

25. The method of claim 23, further comprising selectively repeating said fusing step (e) for each selected vertical interconnection.

26. An integrated circuit fabricated by the method of claim 25.

27. The method of claims 23, wherein said first and second cells are each disposed in arrays having array edges, further comprising the step of disposing said at least one redundant row conductor and at least one redundant column conductor adjacent to said array edges of said arrays.

28. An integrated circuit fabricated by the method of claim 27.

* * * * *